(12) United States Patent
Park

(10) Patent No.: US 7,575,989 B2
(45) Date of Patent: Aug. 18, 2009

(54) METHOD OF MANUFACTURING A TRANSISTOR OF A SEMICONDUCTOR DEVICE

(75) Inventor: Jeong Ho Park, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 420 days.

(21) Appl. No.: 11/615,780

(22) Filed: Dec. 22, 2006

(65) Prior Publication Data

US 2007/0166941 A1 Jul. 19, 2007

(30) Foreign Application Priority Data

Dec. 29, 2005 (KR) ...................... 10-2005-0134177

(51) Int. Cl.
*H01L 21/44* (2006.01)

(52) U.S. Cl. .................... 438/579; 438/578; 438/259; 438/270; 438/589; 257/330; 257/E21.205; 257/E21.438

(58) Field of Classification Search ......... 438/259–261, 438/207–271, 579–585
See application file for complete search history.

(56) References Cited

U.S. PATENT DOCUMENTS

| 5,962,894 A | * | 10/1999 | Gardner et al. | 257/330 |
| 6,500,743 B1 | * | 12/2002 | Lopatin et al. | 438/592 |
| 6,979,634 B2 | * | 12/2005 | Suzuki | 438/585 |
| 2004/0132236 A1 | * | 7/2004 | Doris et al. | 438/182 |

FOREIGN PATENT DOCUMENTS

| CN | 1183638 | 6/1998 |
| CN | 1226752 | 8/1999 |
| CN | 1269608 | 10/2000 |
| JP | 2000-049335 | 2/2000 |

* cited by examiner

*Primary Examiner*—Dung A. Le
(74) *Attorney, Agent, or Firm*—Sherr & Vaughn, PLLC

(57) ABSTRACT

A method of manufacturing a transistor in which gate resistance is lowered and short channel effects are controlled by forming a trench-type gate. The threshold voltage can also be more tightly controlled.

13 Claims, 6 Drawing Sheets

METHOD OF MANUFACTURING A TRANSISTOR OF A SEMICONDUCTOR DEVICE

The present application claims priority under 35 U.S.C. 119 and 35 U.S.C. 365 to Korean Patent Application No. 10-2005-0134177 (filed on Dec. 29, 2005), which is hereby incorporated by reference in its entirety.

BACKGROUND

With progress towards miniaturization and large scale integration of semiconductor devices, the line width of a transistor has become minute. Because of this, hot carrier effects are generated within very small transistors. Hot carrier effects are increased when the transistor channel length is made shorter, but the externally applied voltage is not made proportionately lower, causing an increase in the electric field (volts/meter) accross the channel. The horizontal electric field in the channel is largely concentrated toward the drain end. Hot carrier effects generated by the large electric field cause deterioration of electrical characteristics in the channel near the drain region. Electron/hole pairs are generated by hot carriers in the transistor. Holes leak out toward the substrate. Electrons migrate towards the gate, and become trapped at the lower portion of a gate oxide layer or a spacer, affecting the threshold voltage.

To overcome hot carrier effects, a transistor may have an LDD (lightly doped drain) structure. The implanted ion concentration of the source/drain region formed within the substrate is low near the edges of the gate electrode. In contrast, the ion concentration is high at the center of the source/drain region, creating a graded junction to reduce a voltage gradient, and therefore the strength of the electric field.

However, with the relentless trend towards miniaturization, the channel length has become ever shorter, and the LDD structure has failed to completely control hot carrier effects. The dopant at the LDD region may diffuse into the channel. A high electric field is created between the channel edge and the drain. The hot carrier phenomenon again substantially degrades the performance of the transistor.

Impurities in the source and the drain diffuse to the side portions of the channel during the operation of the transistor, and induce a punch through effect. A special ion implantation process to prevent punch-through may be attempted, but this complicates the manufacturing process. Also, when it is difficult to control the channel length and ion concentration due to ion diffusion and hot carriers, the threshold voltage also becomes difficult to control.

A solution to the above-described problems is disclosed in Korean Patent Laid-open No. 2001-64434. A transistor with a trench-type gate electrode structure, in which the bottom surface of the gate electrode is buried in the substrate between spacers. A gate oxide layer with a concave profile is provided along the side portion and bottom portion of the gate electrode. However, the gate is partially buried while also rising high above silicon substrate. Problems still occur when the device is further miniaturized.

SUMMARY

Embodiments relate to a method of manufacturing a transistor in a highly integrated semiconductor device, in which gate resistance is lowered and short channel effects are controlled by forming a trench-type gate Embodiments relate to a method of manufacturing a transistor in a highly integrated semiconductor device in which a threshold voltage can be controlled. Embodiments relate to a method of manufacturing a transistor of a semiconductor device including depositing a first insulating layer, which may be an oxide or nitride layer, over a semiconductor substrate. A trench is formed to a depth of about 100 Å to 1000 Å by dry etching the first insulating layer and the semiconductor substrate. A first ion implantation is performed over the semiconductor substrate; the first ion implantation controls a threshold voltage of the transistor. A second insulating layer and a first conductive layer are deposited over the semiconductor substrate on which the trench is formed. The second insulating layer and first conductive layer is planarized using a CMP (chemical mechanical polishing) process using the first insulating layer as an etch stop to form a trench gate.

A second conductive layer, which may be between about 100 Å to 1000 Å thick, is deposited over the trench gate and the semiconductor substrate. A mask pattern having a width wider than the trench gate is formed over the second conductive layer. The second conductive layer, the first insulating layer and an upper portion of the semiconductor substrate are patterned using the mask pattern and the mask pattern is removed. A second ion implantation using the second conductive layer as a mask forms a source/drain region and an LDD region. A silicide layer is formed by heat treating over the second conductive layer and over an exposed surface portion of the semiconductor substrate.

The first conductive layer and the second conductive layer may be formed using polysilicon. The second insulating layer may be formed using one of hafnium-based oxide, nitride-based oxide and tantalum-based oxide.

The energy of the second ion implantation for forming the LDD and source/drain region may be between about 10 to 80 KeV. A sacrificial oxide layer may be formed over the substrate prior to the second ion implantation.

BRIEF DESCRIPTION OF DRAWINGS

Example

DETAILED DESCRIPTION

Figure 1:
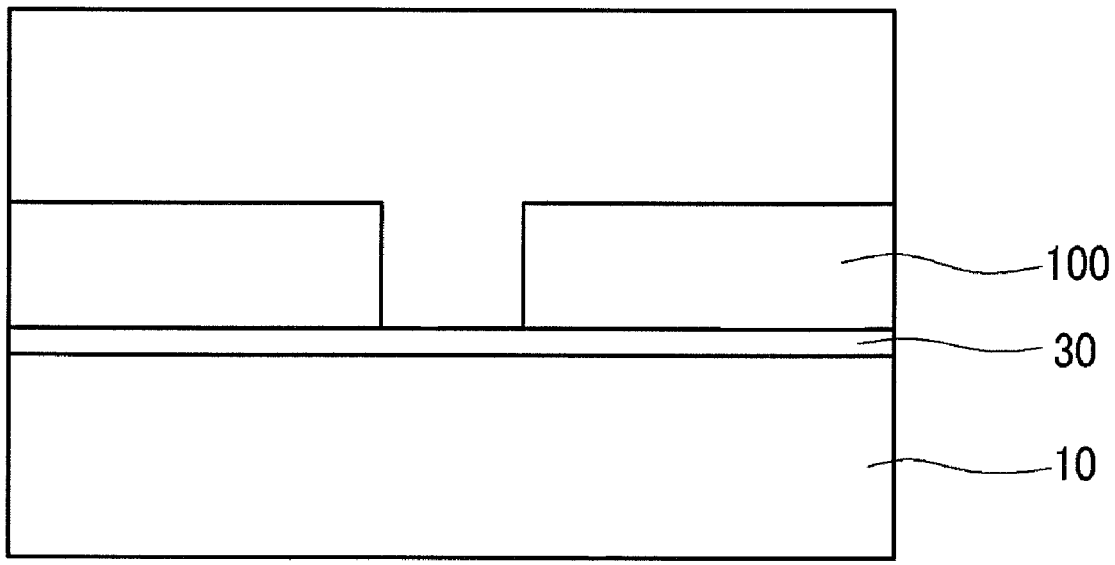
FIGS. 1-6 are process diagrams for illustrating the method of manufacturing a transistor of a semiconductor device according to embodiments.

In the drawings, the thickness of various layers and regions are enlarged to illustrate them exactly. Through the specification, similar elements are designated with the same symbol and number. When one portion of a layer, a film, a region, a plate etc. is described as "on" another portion, it includes the case when the portion is directly on another portion as well as the case when another portion is inserted between the portion and another portion. On the contrary, when the portion is described "directly on" another portion, nothing is inserted between them.

Referring to FIG. 1, a first insulating layer 30 is deposited over a semiconductor substrate 10. First photoresist is deposited, exposed, and developed to form a first photoresist pattern 100 exposing a trench region, for forming a gate. The first insulating layer 30 may be formed using an oxide layer or a nitride layer.

Figure 2:
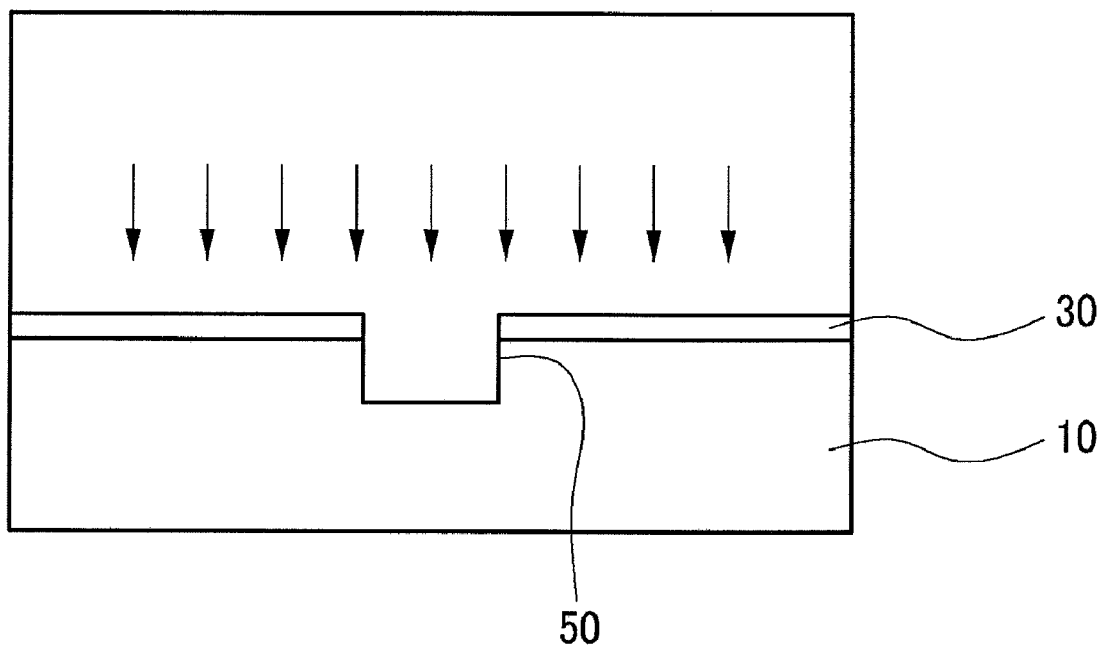

Referring to FIG. 2, the first insulating layer 30 and the semiconductor substrate 10 are etched using the first photoresist pattern 100 as a mask. A trench 50 for forming a gate is created, and the first photoresist pattern 100 is removed. The trench may have a depth of about 100 Å to 1000 Å. The trench may be dry etched. The trench is then subjected to an ion implantation to control the threshold voltage of the transistor.

The first insulating layer functions a buffer layer for protecting the substrate during the ion implantation.

Figure 3:
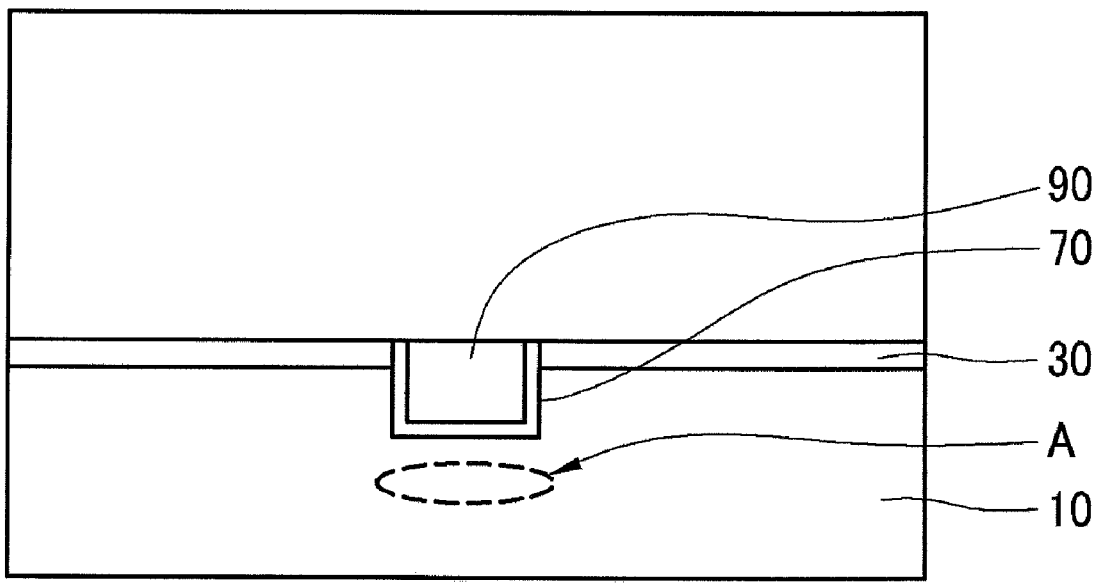

Referring to FIG. 3, a second insulating layer 70 and first conductive layer 90 are deposited and then planarized. An oxide layer may be formed as the second insulating layer over a substrate where a trench is to be formed and a conductive layer for a gate is formed. Then, the first conductive layer 90 and the second insulating layer 70 are planarized using a CMP (chemical mechanical polishing) process. The CMP process may use the first insulating layer as an etch stop, and the CMP process is paused when the first insulating layer is exposed. The first conductive layer may be formed by using polysilicon. To form the second insulating layer, a hafnium-based oxide, nitride-based oxide or tantalum-based oxide can be used. The symbol A in FIG. 3 designates the profile of impurity ions implanted onto the semiconductor substrate for controlling the threshold voltage.

Figure 4:
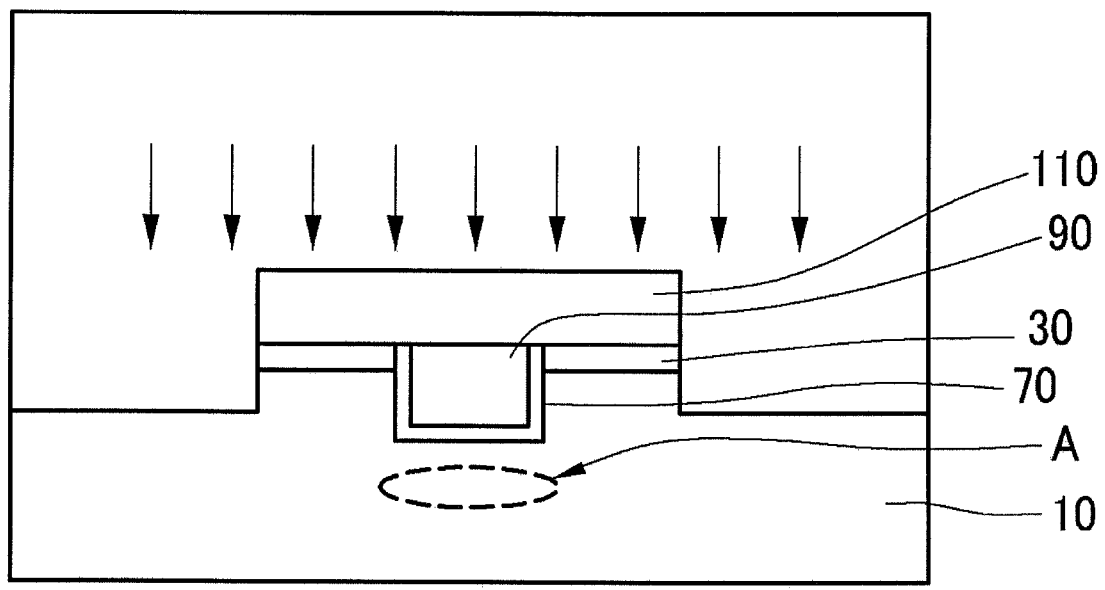

Referring to FIG. 4, after planarizing, a second conductive layer 110 and a second photoresist layer are formed over the substrate. The second photoresist layer is patterned using photolithography to obtain a second photoresist pattern 200. The second conductive layer may be formed using polysilicon. The second conductive layer between about 100 Å to 1000 Å thick. The thickness of the second conductive layer is chosen in consideration of an ion implantation for forming an LDD region and a source/drain region.

Figure 5:
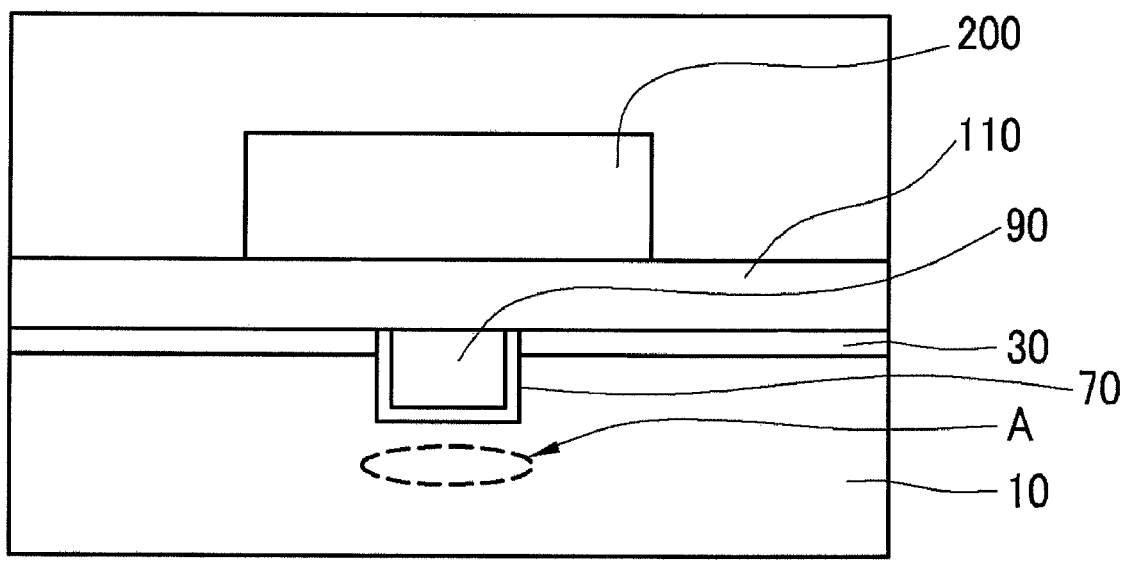

Referring to FIG. 5, the second conductive layer 110, the first insulating layer 30 and the semiconductor substrate 10 are dry etched by using the patterned second photoresist pattern 200 as a mask. Then, the second photoresist 200 is removed. An ion implantation process simultaneously forms an LDD region and a source/drain region. The energy of the ion implantation for forming the source/drain region may be in a range of about 10 to 80 KeV. To protect the substrate during the ion implantation, an oxide layer is formed over the substrate. The oxide layer is removed after completing the ion implantation process. The etched first insulating layer functions in a similar role as a spacer.

Figure 6:
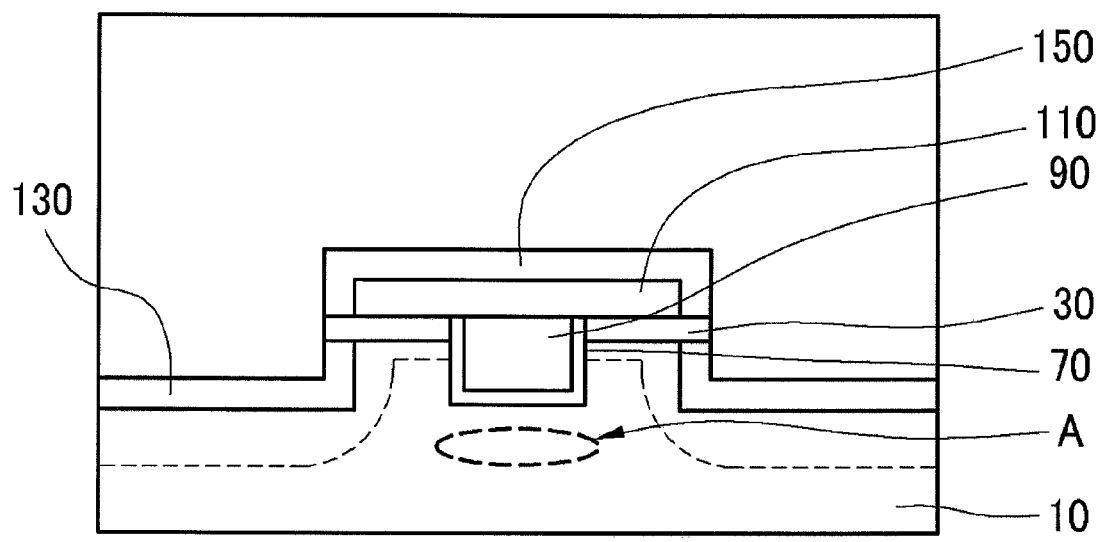

Referring to FIG. 6, a silicide process is executed to heat treat the surface of the LDD region, the source/drain region, and the upper surface portion of the gate electrode 110 to a predetermined temperature to form a silicide layer 130 and a gate silicide layer 150. By forming the silicide layer, the LDD region and the source/drain region are stabilized, and at the same time, the LDD region and the source/drain region are enlarged to control the channel length.

The transistor device formed with the trench as described above has a longer effective channel than a transistor with a gate formed over the substrate. The short channel effect can therefore be reduced. Moreover, because the silicide portion can be made wide, the resistance of the transistor can be lowered. Because the LDD region and the source/drain region can be formed simultaneously with a single mask process, the manufacturing process can be simplified.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method of manufacturing a transistor comprising:
   depositing a first insulating layer over a semiconductor substrate;
   forming a trench by etching the first insulating layer and the semiconductor substrate;
   performing a first ion implantation into the semiconductor substrate;
   depositing a second insulating layer and a first conductive layer over the semiconductor substrate on which the trench is formed;
   planarizing the second insulating layer and first conductive layer to form a trench gate;
   depositing a second conductive layer over the trench gate and the semiconductor substrate;
   forming a mask pattern having a width wider than the trench gate over the second conductive layer;
   patterning the second conductive layer, the first insulating layer and an upper portion of the semiconductor substrate using the mask pattern;
   removing the mask pattern;
   performing a second ion implantation using the second conductive layer as a mask to form a source/drain region; and
   heat treating the semiconductor substrate to form a silicide layer over the second conductive layer and over an exposed surface portion of the semiconductor substrate.

2. The method of manufacturing a transistor as claimed in claim 1, wherein the first insulating layer is one of an oxide layer or a nitride layer.

3. The method of manufacturing a transistor as claimed in claim 1, wherein the depth of the trench is between about 100 Å to 1000 Å.

4. The method of manufacturing the transistor of the semiconductor device as claimed in claim 1, wherein the trench is formed by dry etching.

5. The method of manufacturing a transistor as claimed in claim 1, wherein the first ion implantation controls a threshold voltage of the transistor.

6. The method of manufacturing a transistor as claimed in claim 1, wherein the planarizing process is a CMP (chemical mechanical polishing) process.

7. The method of manufacturing a transistor as claimed in claim 6, wherein the first insulating layer is used as an etch stop layer during the CMP process.

8. The method of manufacturing a transistor as claimed in claim 1, wherein the first conductive layer and the second conductive layer are formed using polysilicon.

9. The method of manufacturing a transistor as claimed in claim 1, wherein the second insulating layer is formed using one of hafnium-based oxide, nitride-based oxide and tantalum-based oxide.

10. The method of manufacturing a transistor as claimed in claim 1, wherein the thickness of the second conductive layer is between about 100 Å to 1000 Å.

11. The method of manufacturing a transistor as claimed in claim 1, wherein the energy of the second ion implantation for forming the source/drain region is between about 10 to 80 KeV.

12. The method of manufacturing a transistor as claimed in claim 1, wherein the second ion implantation for forming the source/drain region also forms a lightly doped drain (LDD) region.

13. The method of manufacturing a transistor as claimed in claim 1, wherein a sacrificial oxide layer is formed over the substrate prior to the second ion implantation.

* * * * *